United States Patent
Li et al.

(10) Patent No.: US 7,172,947 B2
(45) Date of Patent: Feb. 6, 2007

(54) HIGH DIELECTRIC CONSTANT TRANSITION METAL OXIDE MATERIALS

(75) Inventors: Jiutao Li, Boise, ID (US); Shuang Meng, Boise, ID (US)

(73) Assignee: Micron Technology, Inc, Boise, ID (US)

( * ) Notice: Subject to any disclaimer, the term of this patent is extended or adjusted under 35 U.S.C. 154(b) by 0 days.

(21) Appl. No.: 10/940,803

(22) Filed: Aug. 31, 2004

(65) Prior Publication Data

US 2006/0051978 A1  Mar. 9, 2006

(51) Int. Cl.
*H01L 21/31* (2006.01)
*H01L 21/461* (2006.01)

(52) U.S. Cl. .............. 438/396; 438/785; 257/E21.01

(58) Field of Classification Search ........... 438/785, 438/396; 257/E21.008, E21.009, E21.01
See application file for complete search history.

(56) References Cited

U.S. PATENT DOCUMENTS

| | | | |
|---|---|---|---|
| 4,333,808 A * | 6/1982 | Bhattacharyya et al. .............. | 204/192.22 |
| 6,184,072 B1 | 2/2001 | Kaushik et al. ............. | 438/197 |
| 6,436,801 B1 | 8/2002 | Wilk et al. .................. | 438/591 |
| 6,552,388 B2 | 4/2003 | Wilk et al. .................. | 257/324 |
| 6,624,093 B1 | 9/2003 | Lyman et al. ............... | 438/785 |
| 7,071,139 B2 * | 7/2006 | Gole .......................... | 502/200 |
| 2002/0137274 A1 * | 9/2002 | Lee et al. .................... | 438/240 |
| 2003/0072890 A1 * | 4/2003 | Miyazawa ................... | 427/554 |
| 2003/0189247 A1 * | 10/2003 | Nakano et al. ............. | 257/724 |
| 2004/0092073 A1 * | 5/2004 | Cabral et al. ............... | 438/287 |
| 2004/0253839 A1 * | 12/2004 | Shimizu et al. ............. | 438/795 |
| 2005/0170566 A1 * | 8/2005 | Lee et al. .................... | 438/149 |
| 2005/0202222 A1 * | 9/2005 | Cartier et al. ............... | 428/209 |
| 2006/0003602 A1 * | 1/2006 | Yu et al. ..................... | 438/787 |

OTHER PUBLICATIONS

D. Simeone, et al. "Investigation of the zirconia phase transition under irradiation" Journal of Nuclear Materials, vol. 281, Issues 2-3, Oct. 2000, pp. 171-181.*
Clendenin, "Researchers advance on high-k battleground," http://www.eetimes.com/article/, 2 pages (Feb. 26, 2002).
Hyoung et al., "New approaches to improve the endurance of TiN/HfO/sub 2/TiN capacitor during the back-end process for 70nm DRAM device," Electron Devices Meeting, 2003, IEDM '03 Technical Digest, IEEE International, abstract (Dec. 2003).
Lineback, "TI says it found right mixture and process for hafnium-based high-k gate dielectrics," *The Semiconductor Reporter*, http://www.semireporter.com, 2 pages (Dec. 9, 2003).

* cited by examiner

*Primary Examiner*—Caridad Everhart
(74) *Attorney, Agent, or Firm*—Knobbe, Martens, Olson & Bear LLP

(57) ABSTRACT

A transition metal oxide dielectric material is doped with a non-metal in order to enhance the electrical properties of the metal oxide. In a preferred embodiment, a transition metal oxide is deposited over a bottom electrode and implanted with a dopant. In a preferred embodiment, the metal oxide is hafnium oxide or zirconium oxide and the dopant is nitrogen. The dopant can convert the crystal structure of the hafnium oxide or zirconium oxide to a tetragonal structure and increase the dielectric constant of the metal oxide.

30 Claims, 6 Drawing Sheets

HIGH DIELECTRIC CONSTANT TRANSITION METAL OXIDE MATERIALS

FIELD OF THE INVENTION

The present invention relates generally to the field of semiconductor fabrication and more specifically to the field of high dielectric constant materials.

BACKGROUND OF THE INVENTION

Since the introduction of the digital computer, electronic storage devices have been a vital resource for the retention of data. Conventional semiconductor electronic storage devices typically incorporate capacitor and transistor structures, such as Dynamic Random Access Memory (DRAM), which temporarily store data based on the charged state of the capacitor structure. In general, this type of semiconductor Random Access Memory (RAM) often requires densely packed capacitor structures that are easily accessible for electrical interconnection. Many of these capacitor structures are fabricated with layers of material including semiconductor, dielectric, and metal. DRAM typically uses a cell structure based on a capacitor and a transistor.

Integrated circuit manufacturers increasingly face difficulties with scaling. The area of the chip ("real estate") provided for capacitors in DRAM cells is rapidly shrinking. One way to attain smaller capacitor sizes and maintain storage capacity is to make the dielectric constant, or the K value, of the selected dielectric material very high. Metal oxides, especially transition metals, are commonly contemplated for high capacity DRAMs. One example, tantalum oxide ($Ta_2O_5$) has a K-value of approximately 25, and is a preferred dielectric material for DRAM cell capacitors for modern DRAM capacitors. Hafnium oxide ($HfO_2$) is also used as a capacitor dielectric, but the K value is approximately 20. These K-values may not be sufficient as DRAM memory cell capacitors shrink. Barium strontium titanate ($Ba_{0.5}Sr_{0.5}TiO_3$), or BST, has a dielectric constant of approximately 300, but BST is difficult to integrate into an integrated circuit. For these reasons, additional dielectric constant materials are needed for capacitors.

SUMMARY OF THE INVENTION

In one aspect of the invention, a method of forming a high k material is disclosed. The method comprises implanting nitrogen into a high dielectric constant transition metal oxide material.

In another aspect of the invention, a method of forming a capacitor dielectric is provided. The method comprises forming a transition metal oxide layer with a predominantly monoclinic crystal structure over a capacitor electrode. The transition metal oxide layer is doped to convert the predominantly monoclinic crystal structure into a predominantly tetragonal crystal structure.

A method of forming a capacitor on an integrated circuit is disclosed in another aspect of the invention. The method comprises forming a first capacitor electrode and depositing a high dielectric constant material over the first capacitor electrode. The high dielectric constant material is implanted with nitrogen to form a capacitor dielectric that comprises between about 1 atomic % and 20 atomic % nitrogen. The method further comprises forming a second capacitor electrode over the capacitor dielectric.

In another aspect, a capacitor dielectric material for an integrated circuit is disclosed. The capacitor dielectric comprises a nitrogen doped transition metal oxide layer with a tetragonal crystal structure, wherein the capacitor dielectric material has a dielectric constant of greater than 32.

In another aspect of the invention, a high dielectric constant material for an integrated circuit is disclosed. The material comprises nitrogen-doped hafnium oxide with a tetragonal structure.

An integrated circuit with a capacitor array is disclosed in another aspect of the invention. The array comprises a plurality of conductive bottom electrodes. A dielectric layer extends over each bottom electrode. The dielectric layer comprises a transition metal oxide with a non-metal dopant and has a dielectric constant at least 30% higher than the transition metal oxide without the dopant. A conductive upper electrode overlies over each dielectric layer In another aspect, a capacitor for an integrated circuit is disclosed. The capacitor comprises a bottom electrode over a substrate. A dielectric layer overlies the bottom electrode. The dielectric layer comprises a group IVB metal oxide and a non-metal dopant in tetragonal crystal structure. An upper electrode extends over the dielectric layer.

DETAILED DESCRIPTION OF THE PREFERRED EMBODIMENT

Figure 1:
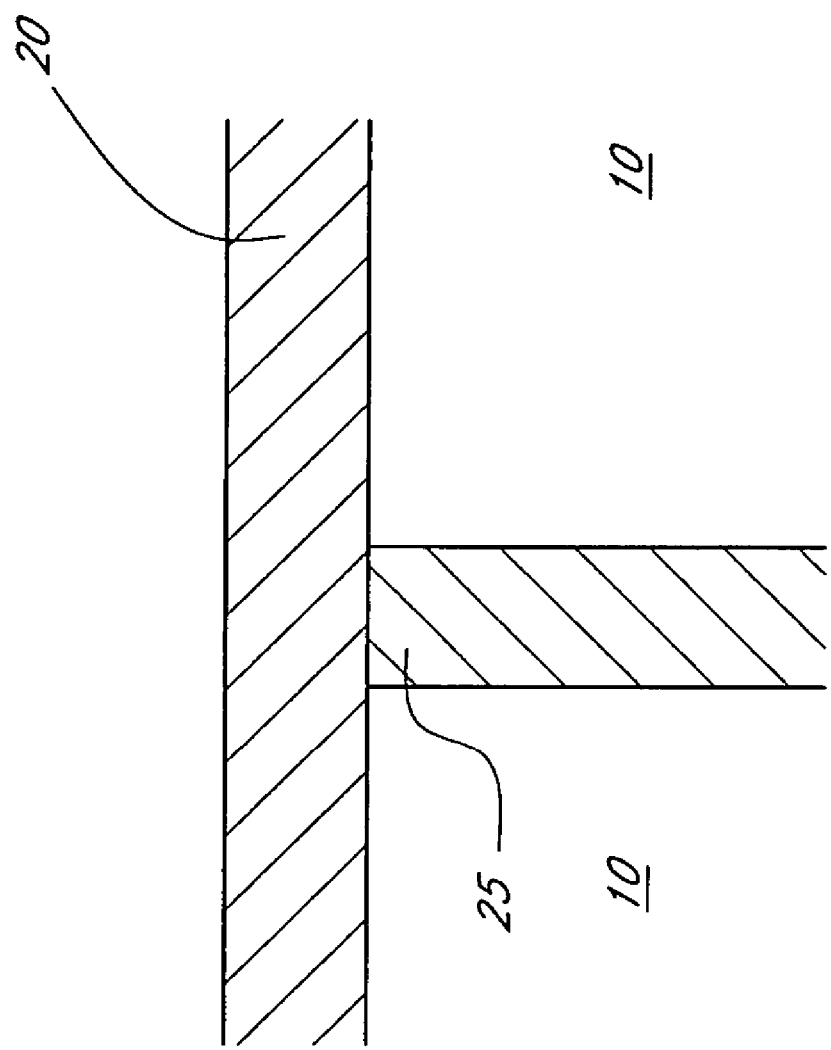
FIG. 1 is a schematic cross section of a bottom electrode layer over a substrate.

In a preferred embodiment, a transition metal oxide is doped with ions in order to increase the dielectric constant (K) of the metal oxide. Preferably, the dopant is provided via ion implantation. Implantation alters the crystal structure of the dielectric material and enhances the insulating properties. Preferably, a non-metal is implanted into a transition metal oxide dielectric layer, preferably an early transition metal oxide layer. In one preferred embodiment, nitrogen ions are implanted into hafnium oxide. The crystal structure of the hafnium oxide material can be changed from a monoclinic structure to a tetragonal structure using nitrogen ion implantation.

Ion implantation is a materials engineering process by which ions of a source material can be implanted into a target solid material in order to change the physical properties of the target material. When performing ion implantation, atoms or molecules of the source material are ionized and accelerated in an electric field. The ions collide with the target material and travel until their motion is slowed to a stop.

A wide variety of combinations of target material and implanted ions is possible. The dose of the implanted ions can vary between $10^{11}$ and $10^{18}$ cm$^{-2}$. Usually, the acceleration energy lies between several keV and several hundred keV, but some equipment allows energies up to several MeV. The depth of the implanted ions in the substrate depends on the mass of the implanted ions, their energy, the mass of the atoms of the target material, crystal structure and the direction of incidence. As an example, the mean range of 100 keV phosphorus ions in silicon is about 150 nm.

Implantation offers several advantages over other processes to introduce nitrogen. First, implantation is generally a short process that is easily repeatedly reproduced. Unlike thermal nitridation (e.g. by ammonia anneal), implantation employs relatively low temperatures. Also, previous nitrogen-doped hafnium oxide layers had only somewhat increased dielectric constants, which were typically below 25. Implantation is also especially useful for thin layers, such as capacitor dielectric layers. The ability to configure and control the depth and concentration of the dopants within the target material is also helpful to control dopant distribution.

Capacitor Embodiment

In a preferred embodiment, nitrogen is implanted in a transition metal oxide in order to increase the dielectric constant. The crystal structure of the dielectric, which affects the dielectric constant, can be altered by the implantation. Some layers with particular crystal structures can be difficult to form in the context of an integrated circuit. For example, it is very difficult to deposit $HfO_2$ in its tetragonal crystal structure. However, by doping the layer, the monoclinic structure of $HfO_2$ can be altered to form a predominantly tetragonal structure. A table of transition metal oxides and other capacitor dielectrics with their dielectric constants and possible crystal structures appears below.

TABLE I

Properties of Dielectric Materials:

| Material | Dielectric constant | Band gap Energy (eV) | Possible crystal structures |
|---|---|---|---|
| $SiO_2$ | 3.9 | 8.9 | Amorphous |
| $Si_3N_4$ | 7.5 | 1 | Amorphous |
| $Al_2O_3$ | 9 | 8.7 | Amorphous |
| $Y_2O_3$ | 15 | 5.6 | Cubic |
| $La_2O_3$ | 30 | 4.3 | Hexagonal, cubic |
| $Ta_2O_5$ | 26 | 4.5 | Orthorhombic |
| $TiO_2$ | 80 | 3.5 | Tetragonal (rutile, anatase) |
| $HfO_2$ | 25 | 5.7 | Monoclinic, tetragonal, cubic |
| $ZrO_2$ | 25 | 7.8 | Monoclinic, tetragonal, cubic |

In order to increase capacitance per unit area, a capacitor dielectric preferably has a constant of greater than silicon oxide. High dielectric constant capacitor dielectrics, as used herein, have a dielectric constant greater than aluminum oxide (K=9). Transition metal oxides are particularly suited to use as capacitor dielectric because, among other reasons, of the wide range of deposition options available, such as chemical vapor deposition (CVD) and atomic layer deposition (ALD). Individual metal oxides have particularly promising properties. For example, hafnium oxide combines a high dielectric constant with excellent thermal stability and high band gap.

In an embodiment illustrated in FIG. 1, a bottom, or lower, electrode 20 is formed on a substrate that includes a thick insulating layer 10, which insulates devices beneath the bottom electrode 20. The bottom electrode 20 serves as the storage electrode. A plug 25, such as polysilicon or tungsten, connects bottom electrode 20 to underlying devices, such as memory cell transistors. Many conductive materials can be used as the bottom electrode 20, including titanium nitride, polysilicon, and metals. Skilled artisans will appreciate that the bottom electrode can be deposited by any of several deposition processes. The material of the bottom electrode 20 is preferably selected to resist oxidation and oxygen diffusion during capacitor dielectric processing. Examples of such materials include conductive barrier materials, such as tantalum nitride (TaN), titanium nitride (TiN), and tungsten nitride (WN).

Figure 2:
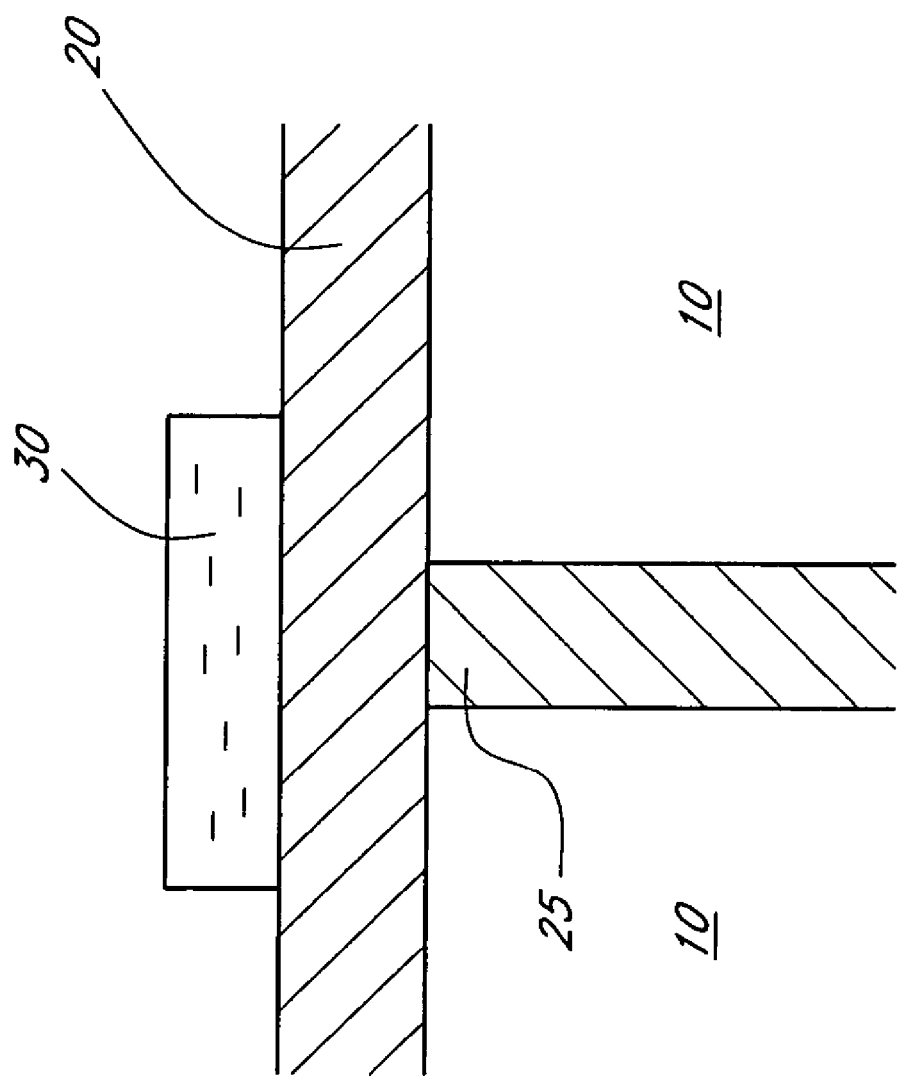
FIG. 2 illustrates the bottom electrode layer of FIG. 1 masked to form an unconnected electrode.
Figure 3:
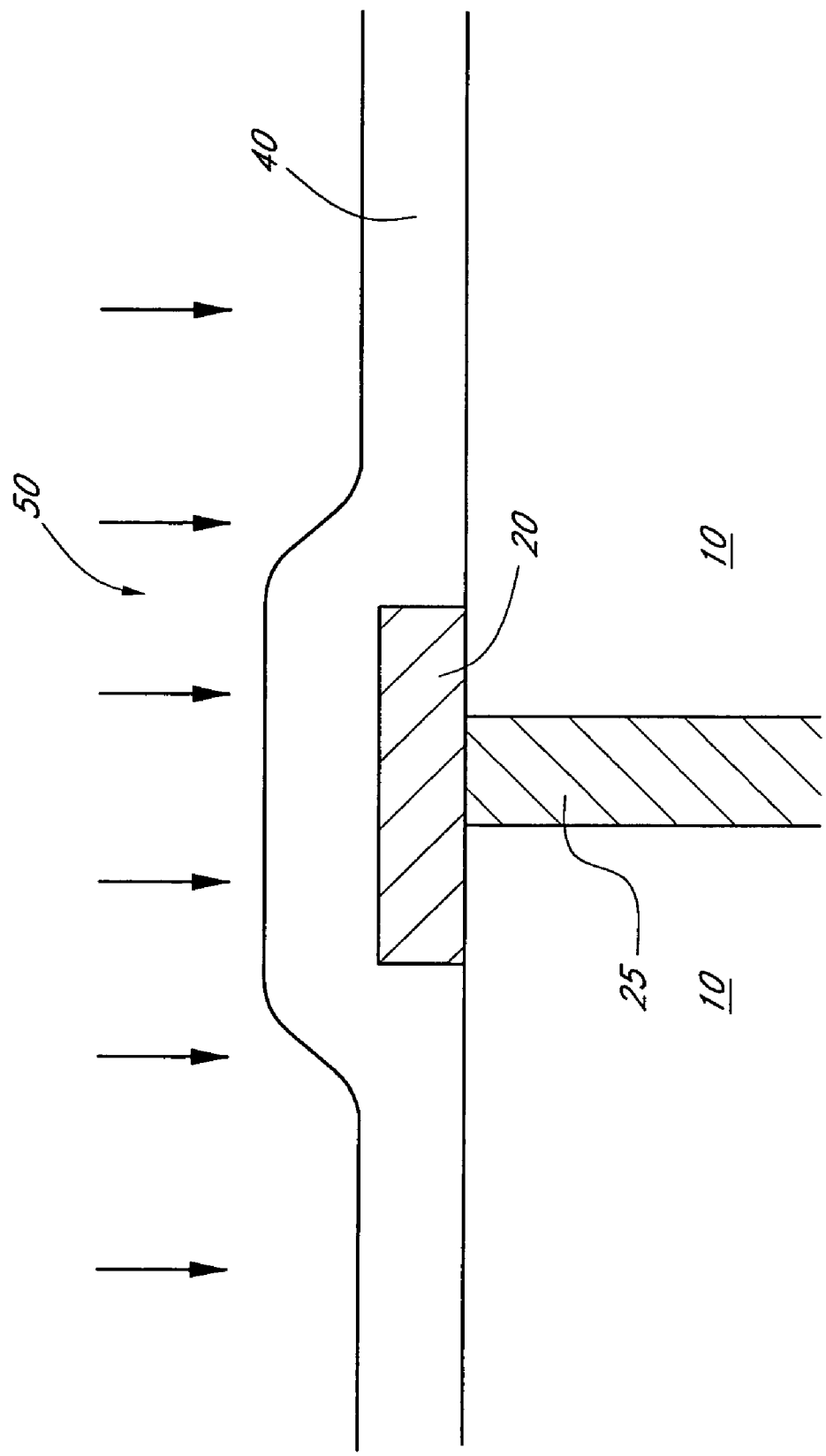
FIG. 3 illustrates the bottom electrode of FIG. 2 after etching to isolate and deposition of a metal oxide layer, and shows implantation of the metal oxide layer.

FIG. 2 illustrates forming a mask 30 over the bottom electrode 20. In a preferred embodiment, a photoresist layer is formed, patterned, and developed over the bottom electrode 30. However, other masking processes, such as hard masking can also be used. Once the mask 30 is formed, the unmasked portions of the bottom electrode layer 20 are removed to form a properly shaped bottom electrode 20 as seen in FIG. 3. Other, more complex, shapes can be used for the bottom electrode, including containers, fins, rugged surfaces, etc., to further increase capacitance.

As illustrated in FIG. 3, a metal oxide layer 40 is deposited over the bottom electrode 20. In a preferred embodiment, the metal oxide layer 40 is a transition metal oxide, more preferably a group IVB metal oxide. Most preferably the metal oxide layer 40 is hafnium oxide or zirconium oxide. Hafnium oxide ($HfO_2$) or zirconium oxide ($ZrO_2$) can be deposited by a CVD or an ALD process. Preferably the metal oxide layer 40 has a thickness of between about 30 Å and 200 Å, more preferably between about 70 Å and 120 Å. In a preferred embodiment, a hafnium oxide metal oxide layer 40 is deposited over the bottom electrode 20 in a CVD chamber using a hafnium precursor selected from the group consisting of tetrakis (ethylmethylamido)hafnium ($Hf(tMe)_4$), tetrakis(dimethylamido)hafnium ($[(CH_3)_2N]_4Hf$), and hafnium chloride ($HfCl_4$). In another preferred embodiment, a zirconium oxide metal oxide layer 40 is deposited over the bottom electrode 20 in a CVD chamber using a zirconium precursor selected from the group consisting of tetrakis (ethylmethylamido)zirconium ($Zr(NEtMe)_4$), tetrakis(dimethylamido) zirconium ($[(CH_3)_2N]_4Zr$,), and zirconium chloride ($ZrCl_4$). Preferably, the temperature of the deposition process is between 275° C. and 375° C., more preferably between about 300° C. and 350° C. Preferably, the pressure for the deposition process is greater than 1 Torr. The hafnium oxide or zirconium oxide metal oxide layer 40 generally has a monoclinic crystal structure as deposited, as is typically the case of CVD-deposited films of these materials.

As illustrated in FIG. 3, ions 50, preferably nitrogen ions, are implanted into the metal oxide layer 40. Neutral elements, such as argon and neon may also be implanted. Preferably, using ion-beam implantation, a very low energy is used to accelerate the ions into the metal oxide layer 40 so that the quantity of ions that infiltrate the bottom electrode 20 can be minimal. However, the exact energy depends on the thickness of the metal oxide layer 40. Additionally, if the bottom electrode 20 includes a metal nitride, such as TiN, infiltration of the bottom electrode 20 does not substantially alter the properties of the electrode 20. In a preferred embodiment, the energy level is just sufficient for ions 50 to reach the interface between the metal oxide layer 40 and the bottom electrode layer 20 and to attain even ion distribution throughout the depth of the metal oxide layer 40. For example, when the metal oxide layer 40 has a thickness of 90 Å, the energy is preferably between about 1.2 KeV and 1.8 KeV, more preferably between about 1.3 KeV and 1.7 KeV. Preferably, the crystal structure of hafnium oxide or zirconium oxide is converted from a predominantly monoclinic structure to a predominantly tetragonal structure during this implantation step. A skilled practitioner will be able to determine a proper energy setting in order to satisfy the aim of evenly distributing the ions throughout the metal oxide layer 40 without infiltrating the bottom electrode layer 20.

As noted, the implant dose is also dependent upon the thickness of the metal oxide layer 40. Preferably, the metal oxide layer 40 after implantation incorporates between about 1 atomic % and 20 atomic % of the dopant, more preferably between about 3 atomic % and 10 atomic %. To achieve these concentrations at approximately 90 Å, a preferred nitrogen ion dose is between about $1*10^{15}$ cm$^{-2}$ and $2*10^{16}$ cm$^{-2}$, more preferably between about $3*10^{15}$ cm$^2$ and $1*10^{16}$ cm$^{-2}$. For neutral materials, such as argon, similar doses can be used.

In addition to traditional beam implantation, ion doping by pulsed laser ablation and deposition (PLAD) or plasma doping can also be used to dope the dielectric material. These techniques are readily adaptable to the materials described herein by the skilled practitioner. In particular, PLAD provides a very uniform doping profile in the metal oxide layer. PLAD is particularly useful in the use of doping a trench capacitor dielectric or a container capacitor, whereby interior sidewalls are doped with nitrogen ions. Conditions to achieve conversion from a predominantly monoclinic crystal structure to a predominantly tetragonal structure can be determined by the skilled artisan using routine experimentation in view of the disclosure herein.

Figure 4:
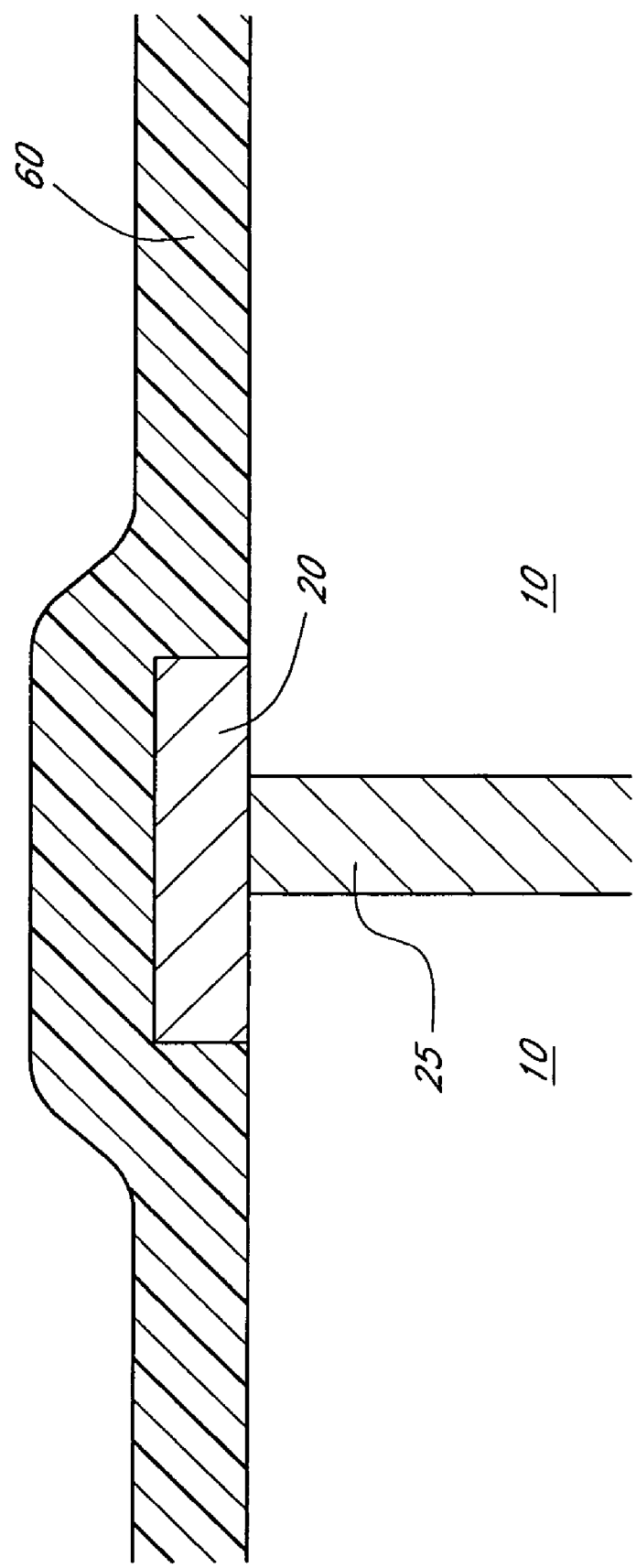
FIG. 4 illustrates a doped metal oxide layer over the bottom electrode of FIG. 3.

Referring to FIG. 4, in a preferred embodiment, the wafer is annealed after a high-K resultant metal oxynitride layer 60 has been implanted. A preferred anneal process is conducted for between about one and ten minutes in an inert environment in a single wafer chamber, preferably a rapid thermal processing (RTP) chamber. More preferably, the anneal process is conducted in argon. Preferably, the temperature in the chamber is between about 400° C. and 900° C., more preferably between about 500° C. and 700° C.

The implantation has several benefits for the dielectric layer. First, the dielectric constant substantially increases post anneal. For hafnium oxide, the dielectric constant preferably rises from about 25 to over 32, more preferably greater than 35, most preferably greater than 37. The dielectric constant of the dielectric layer 60 thus preferably increases by more than 30%, more preferably by at least 40%, most preferably by at least 45%. The capacitance for a capacitor incorporating such material similarly increases. In one example, the capacitance is increased from about $5.9*10^{-7}$ F to $9*10^{-7}$ F. The implantation into the transition metal oxide also decreases the leakage current, preferably at least a 50% reduction, more preferably at least a 75% reduction, most preferably at least a 85% reduction. For example, implantation of nitrogen into hafnium oxide reduces the leakage current by approximately an order of magnitude. The implantation of ions, particularly nitrogen, into the dielectric layer 60 can also improve the electrical properties of the interface between the dielectric layer 60 and the lower electrode 20.

Figure 5:
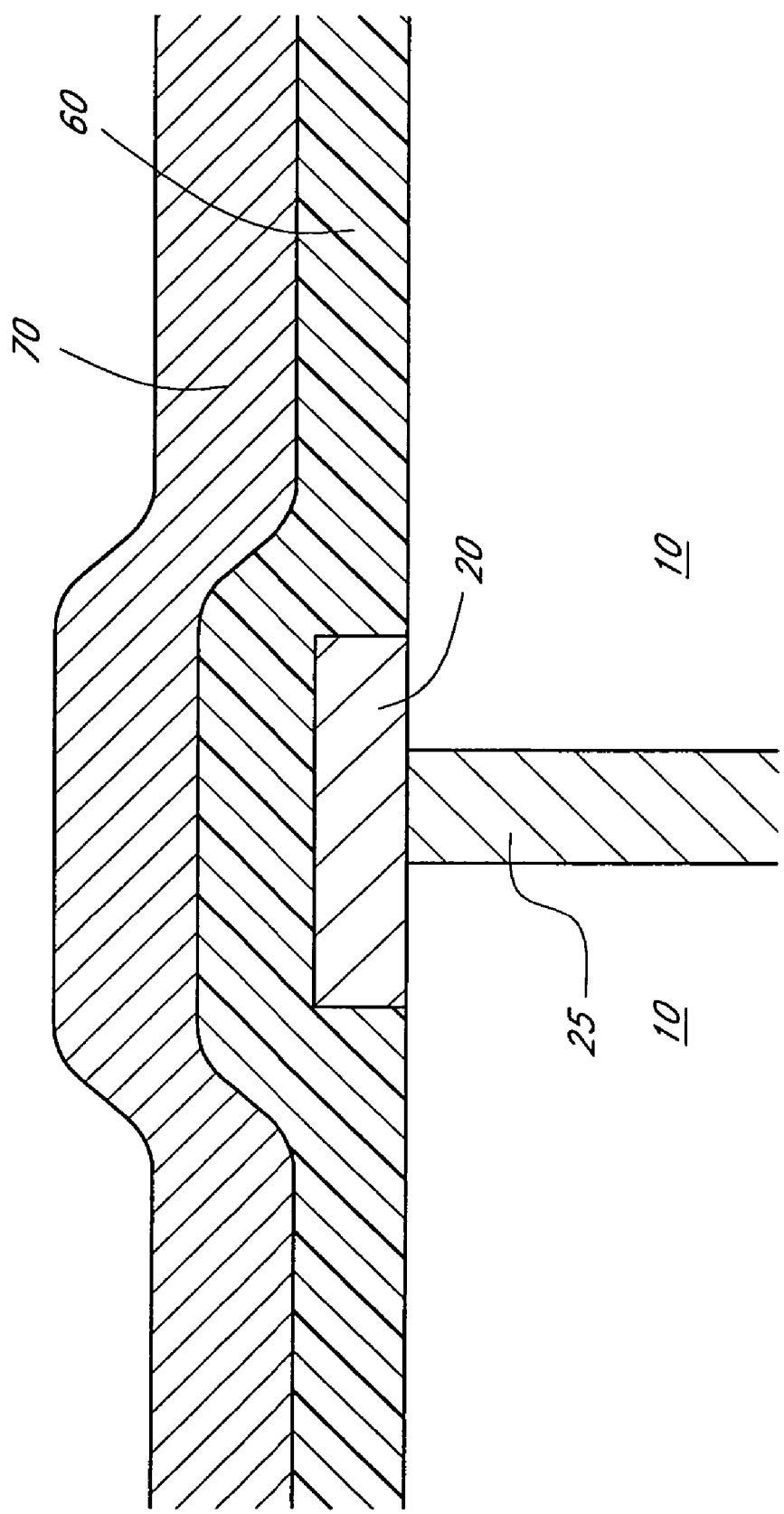
FIG. 5 illustrates a top electrode over the structure of FIG. 4.

Referring to FIG. 5, once the high-K metal oxynitride capacitor dielectric layer 60 has been formed, a conductive upper electrode 70 is deposited. Preferably a metallic upper electrode 70 is formed. Metals such as tungsten and platinum can be used as the upper electrode 70.

The upper electrode could be a common electrode for use as a reference electrode for the whole array, or the upper electrode 70 could be patterned to form an individual top electrode. The capacitor can then be incorporated into a memory cell or other integrated circuit device, which in turn is employed in a larger computer system.

Structure

The increased dielectric constant material can be used for many types of capacitors, especially those that require thin dielectric layers. In a preferred embodiment illustrated in FIG. 5, a capacitor is formed with a bottom electrode 20 over a substrate, illustrated as including a thick insulating layer 10 and a plug 25. Preferably, the bottom electrode 20 includes titanium nitride. A high-K dielectric constant material, preferably hafnium oxide or zirconium oxide, that includes a dopant is used as the capacitor dielectric 60. Preferably, the capacitor dielectric 60 has nitrogen implanted into the crystal structure. In a preferred embodiment, the capacitor dielectric 60 has a predominantly tetragonal crystal structure, more preferably the capacitor dielectric 60 has a completely tetragonal structure. The dielectric layer preferably has between 1 atomic % and 20 atomic % nitrogen, more preferably between about 3 atomic % and 10 atomic %. Small thickness changes have also been found at the corners of patterned capacitors, resulting in slight rounding of sharp corners. This thickness change is possibly due to a sputter etch effect from ion implantation.

Figure 6:
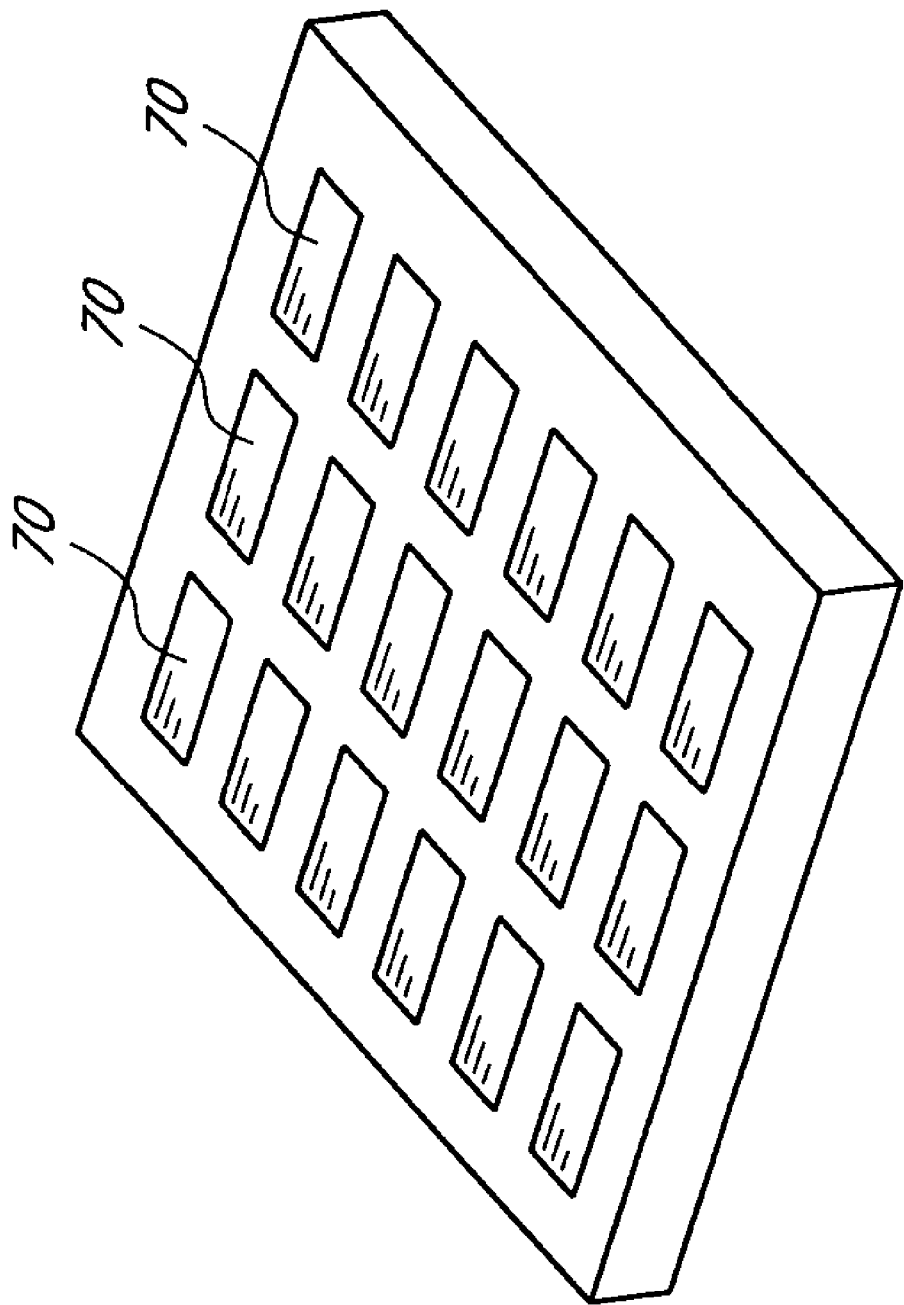
FIG. 6 schematically illustrates an array of capacitors according to an embodiment of the invention.

The capacitors can be used to form a capacitor array that can be used in a memory device, such as a DRAM. FIG. 6 schematically illustrates such an array. An actual memory array has a large number of capacitors in a similar arrangement. Further connections can be made to the capacitor through the bottom electrode to underlying transistors and through the upper electrodes 70 to logic circuitry for sensing capacitor storage state. While the upper electrodes are shown as a plurality of separate electrodes in FIG. 6, the upper electrode can also be a common electrode to the entire array. In a preferred embodiment the capacitor array is used to form memory cells for a DRAM device by connecting the capacitor to a transistor.

It will be appreciated by those skilled in the art that various omissions, additions and modifications may be made to the methods and structures described above without departing from the scope of the invention. All such modifications and changes are intended to fall within the scope of the invention, as defined by the appended claims.

We claim:

1. A method of forming a high dielectric constant (k) material comprising implanting nitrogen into a high dielectric constant transition metal oxide material having an initial crystal structure, wherein implanting comprises converting the initial crystal structure to a predominantly tetragonal crystal structure.

2. he method of claim 1, wherein implanting nitrogen comprises using an energy level of between about 1.2 KeV and 1.8 KeV.

3. The method of claim 1, wherein implanting nitrogen into the high dielectric constant oxide material comprises implanting nitrogen into a zirconium oxide layer.

4. The method of claim 1, wherein implanting nitrogen into the high dielectric constant oxide material comprises using ion beam implantation.

5. The method of claim 1, wherein implanting nitrogen into the high dielectric constant oxide material comprises implanting nitrogen into a hafnium oxide layer.

6. The method of claim 5, wherein implanting nitrogen into the hafnium oxide layer comprises implanting between about $1*10^{15}$ atoms per cm$^2$ and $2*10^{16}$ atoms per cm$^2$.

7. The method of claim 5, wherein implanting nitrogen into the hafnium oxide layer comprises implanting nitrogen into a hafnium oxide layer between about 30 Å and 200 Å thick.

8. The method of claim 7, wherein implanting nitrogen into the hafnium oxide layer comprises implanting nitrogen into a hafnium oxide layer between about 70 Å and 120 Å thick.

9. The method of claim 1, wherein the initial crystal structure is predominantly monoclinic.

10. A method of forming a capacitor dielectric, comprising:
   forming a transition metal oxide layer with a predominantly monoclinic crystal structure over a capacitor electrode;
   doping the transition metal oxide layer with a non-metal to convert the predominantly monoclinic crystal structure into a predominantly. tetragonal crystal structure; and
   annealing the transition metal oxide layer in an inert environment.

11. The method of claim 10, wherein annealing the transition metal oxide layer comprises annealing in an argon environment.

12. The method of claim 10, wherein annealing the transition metal oxide layer comprises using a temperature of between about 400° C. and 900° C.

13. The method of claim 10, wherein annealing the transition metal oxide layer comprises using a temperature of between about 500° C. and 700° C.

14. The method of claim 10, wherein forming the transition metal oxide layer comprises forming a hafnium oxide layer.

15. The method of claim 10, wherein forming the transition metal oxide layer comprises forming a zirconium oxide layer.

16. The method of claim 10, wherein doping the transition metal oxide layer comprises using a pulsed laser ablation technique.

17. The method of claim 10, wherein doping the transition metal oxide layer comprises exposing the transition metal oxide layer to a plasma containing nitrogen.

18. The method of claim 10, wherein doping the transition metal oxide layer comprises implanting a dopant into the transition metal oxide layer.

19. The method of claim 18, wherein implanting the dopant into the transition metal oxide layer comprises using ion beam implantation.

20. The method of claim 18, wherein implanting the dopant into the transition metal oxide layer comprises implanting nitrogen.

21. A method of forming a capacitor dielectric, comprising:
   forming a transition metal oxide layer with a predominantly monoclinic crystal structure over a capacitor electrode; and
   doping the transition metal oxide layer with a non-metal to convert the predominantly monoclinic crystal structure into a predominantly tetragonal crystal structure,
   wherein forming the transition metal oxide layer comprises forming the transitional metal oxide layer with a thickness of between about 30 Å and 200 Å.

22. A method of forming a capacitor on an integrated circuit comprising
   forming a first capacitor electrode;
   depositing a high dielectric constant material over the first capacitor electrode;
   implanting the high dielectric constant material with nitrogen to form a capacitor dielectric that comprises between about 1 atomic % and 20 atomic % nitrogen in a tetragonal crystal structure; and
   forming a second capacitor electrode over the capacitor dielectric.

23. The dielectric material of claim 22, wherein the capacitor dielectric comprises between about 3 atomic % and 10 atomic % nitrogen.

24. The method of claim 22, further comprising annealing the dielectric layer.

25. The method of claim 22, wherein forming a first capacitor electrode comprises depositing a titanium nitride layer.

26. The method of claim 22, wherein forming a first capacitor electrode comprises depositing a polysilicon layer.

27. The method of claim 22, wherein depositing the high dielectric constant material comprises depositing zirconium oxide.

28. The method of claim 22, wherein depositing the high dielectric constant material comprises depositing hafnium oxide.

29. The method of claim 22, wherein depositing the high dielectric constant material comprises depositing a high dielectric constant material layer with a thickness of between about 30 Å and 200 Å.

30. The method of claim 29, wherein depositing the high dielectric constant material comprises depositing a high dielectric constant material layer with a thickness of between about 70 Å and 120 Å.

* * * * *